United States Patent
Hsieh et al.

(10) Patent No.: US 11,249,055 B2
(45) Date of Patent: Feb. 15, 2022

(54) ACOUSTIC TESTING OF BATTERIES IN PORTABLE DEVICES

(71) Applicant: Feasible, Inc., Emeryville, CA (US)

(72) Inventors: Andrew Gaheem Hsieh, Berkeley, CA (US); Anne Wilkinson, Seattle, WA (US); Robert Charles Mohr, Berkeley, CA (US); Shaurjo Biswas, El Cerrito, CA (US); Barry James Van Tassell, El Cerrito, CA (US); Daniel Artemis Steingart, Princeton, NJ (US)

(73) Assignees: Feasible, Inc., Emeryville, CA (US); The REGENTS OF THE UNIVERSITY OF CALIFORNIA, Oakland, CA (US)

( * ) Notice: Subject to any disclaimer, the term of this patent is extended or adjusted under 35 U.S.C. 154(b) by 197 days.

(21) Appl. No.: 16/141,166

(22) Filed: Sep. 25, 2018

(65) Prior Publication Data
US 2019/0094189 A1     Mar. 28, 2019

Related U.S. Application Data

(60) Provisional application No. 62/564,016, filed on Sep. 27, 2017.

(51) Int. Cl.
*G01N 29/44*     (2006.01)
*H01M 10/48*     (2006.01)
(Continued)

(52) U.S. Cl.
CPC ......... *G01N 29/4436* (2013.01); *G01N 29/07* (2013.01); *G01N 29/343* (2013.01);
(Continued)

(58) Field of Classification Search
CPC .......... G01N 29/4427; G01N 29/4436; G01N 29/043; G01N 29/07; G01N 29/343;
(Continued)

(56) References Cited

U.S. PATENT DOCUMENTS

| | | | |
|---|---|---|---|
| 8,156,809 B2* | 4/2012 | Tierling | G06F 3/016 |
| | | | 73/579 |
| 2011/0072902 A1* | 3/2011 | Mukai | G01M 99/007 |
| | | | 73/579 |

(Continued)

FOREIGN PATENT DOCUMENTS

| DE | 93 16 822 U1 | 7/1994 |
|---|---|---|
| WO | 2016/020358 A2 | 2/2016 |

OTHER PUBLICATIONS

International Search Report and Written Opinion dated Jan. 8, 2019 in PCT/US18/052785.

*Primary Examiner* — Lisa M Caputo
*Assistant Examiner* — Rose M Miller
(74) *Attorney, Agent, or Firm* — Polsinelli LLP

(57) ABSTRACT

Systems and methods for testing a component, such as a battery, of a host device include transmitting one or more input acoustic signals into at least a portion of the host device, through input transducers coupled to the host device. One or more response signals generated in response to the one or more input acoustic signals are detected through recording transducers coupled to the host device. The one or more response signals are stored and compared with reference signals or datasets. One or more physical characteristics of the component or battery are analyzed based on the comparison.

18 Claims, 8 Drawing Sheets

(51) Int. Cl.
  *G01R 31/382* (2019.01)
  *G01R 31/385* (2019.01)
  *G01N 29/34* (2006.01)
  *G01N 29/46* (2006.01)
  *G01N 29/07* (2006.01)
  *H04B 11/00* (2006.01)

(52) U.S. Cl.
  CPC ......... *G01N 29/4454* (2013.01); *G01N 29/46* (2013.01); *G01R 31/382* (2019.01); *G01R 31/385* (2019.01); *H01M 10/48* (2013.01); *G01N 2291/048* (2013.01); *G01N 2291/102* (2013.01); *G01N 2291/2697* (2013.01); *H01M 2220/30* (2013.01); *H04B 11/00* (2013.01)

(58) Field of Classification Search
  CPC ... G01N 2291/0231; G01N 2291/2698; G01N 2291/048; G01N 2291/102; G01N 2291/2697; G01R 31/385; G01R 31/382; H01M 10/48; H01M 2220/30; H04B 11/00
  USPC .................................. 73/602, 579, 582, 627
  See application file for complete search history.

(56) References Cited

U.S. PATENT DOCUMENTS

| | | | |
|---|---|---|---|
| 2013/0269436 A1* | 10/2013 | Couse | G01N 29/4427 73/582 |
| 2015/0300993 A1* | 10/2015 | Prest | G01N 29/26 148/508 |
| 2016/0197382 A1 | 7/2016 | Sood et al. | |

* cited by examiner

ACOUSTIC TESTING OF BATTERIES IN PORTABLE DEVICES

CROSS-REFERENCE TO RELATED APPLICATIONS

The present Application for Patent claims the benefit of Provisional Patent Application No. 62/564,016 entitled "ACOUSTIC TESTING OF BATTERIES IN PORTABLE DEVICES" filed Sep. 27, 2017, and assigned to the assignee hereof and hereby expressly incorporated herein by reference in its entirety.

FIELD OF DISCLOSURE

Disclosed aspects are directed to testing and analysis of host systems comprising batteries. More particularly, exemplary aspects are directed to non-invasive and fast acoustic testing of batteries contained in portable devices.

BACKGROUND

Conventional methods for inspecting a battery contained within a device (e.g., a portable device such as a cell phone, tablet, e-reader, laptop, power tool, e-cigarette, hover board, etc.) involve irradiating the device with x-rays and photon sources and using electrical diagnostic methods without removing the battery from the device. Alternatively, the battery may be inspected upon removing the battery from the device. In situations involving device reliability testing, device quality control inspection, maintenance or warranty inspection, screening at security or law enforcement checkpoints, or other applications in which quick, non-invasive analysis of the battery is desired, none of these conventional methods are seen to be suitable.

Electrical methods for battery inspection are cheap and fast, which is why they are commonly used, but such methods may provide inaccurate information about the physical characteristics of the battery. X-rays and photon sources are accurate but expensive, and are not suitable for quick screening performed in commercial installations. For many newer devices, removal of the battery may not be readily possible without special equipment and time consuming processes. Additionally, in the case of security or law enforcement screening, such inspection methods may prove dangerous if the batteries have been tampered with or are counterfeit.

Accordingly, there is a recognized need for fast, reliable, efficient, and non-invasive battery inspection techniques which avoid the aforementioned drawbacks of the conventional battery inspection methods.

SUMMARY

Exemplary aspects of this disclosure are directed to systems and methods for testing a component, such as a battery, of a host device. One or more input acoustic signals are transmitted into at least a portion of the host device, through input transducers coupled to the host device. One or more response signals generated in response to the one or more input acoustic signals are detected through recording transducers coupled to the host device. The one or more response signals are stored and compared with reference signals or datasets. One or more physical characteristics of the component or battery are analyzed based on the comparison.

For example, an exemplary aspect is directed to a method of analyzing a battery, the method comprising transmitting one or more input acoustic signals into at least a portion of a host device comprising the battery, detecting one or more response signals generated in response to the one or more input acoustic signals, and analyzing one or more physical characteristics of the battery based on the one or more response signals.

Another exemplary aspect is directed to a method of analyzing a host device component, the method comprising transmitting one or more input acoustic signals into at least a portion of a host device comprising the host device component, detecting one or more response signals generated in response to the one or more input acoustic signals, and analyzing one or more physical characteristics of the host device component based on the one or more response signals.

Yet another exemplary aspect is directed to an apparatus comprising means for transmitting one or more input acoustic signals into at least a portion of a host device comprising a host device component, means for detecting one or more response signals generated in response to the one or more input acoustic signals, and means for analyzing one or more physical characteristics of the host device component based on the one or more response signals.

BRIEF DESCRIPTION OF THE DRAWINGS

The accompanying drawings are presented to aid in the description of various aspects of the invention and are provided solely for illustration and not limitation.

DETAILED DESCRIPTION

Figure 1A:
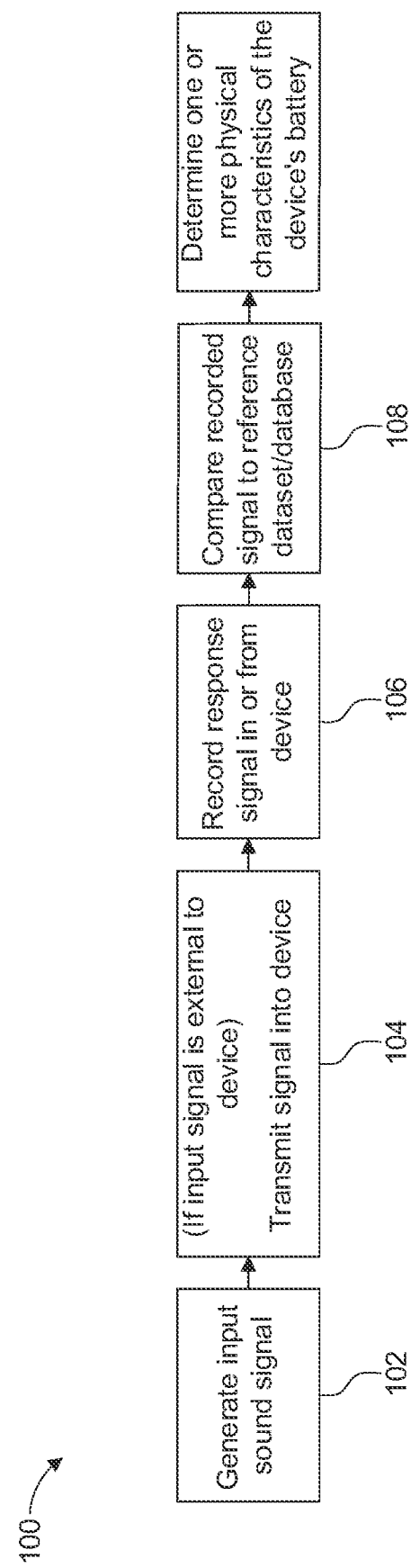
FIGS. 1A-B illustrate exemplary methods for acoustic analysis of components of a host device, according to aspects of this disclosure.

Aspects of the invention are disclosed in the following description and related drawings directed to specific aspects of the invention. Alternate aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a," "an," and "the" are intended to include the plural forms as well, unless the context clearly indicates otherwise.

It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

In aspects of this disclosure, sound-based or acoustic approaches for inspecting or analyzing components within a host device are described. For instance, analyses such as acoustic time-of-flight (TOF) or acoustic resonance spectroscopy analyses of the host device using ultrasonic signals (or any other acoustic/sound-based signals) are described, to determine information regarding the physical characteristics of the internal components of the host device. Specifically, the disclosed analyses may be conducted with the internal components present in the device, without having to remove these internal components from the host device for analyzing them separately. It is recognized that even though one or more batteries of the host device are discussed as one example of the internal components of the host device that may be analyzed in exemplary aspects, the disclosed techniques are equally applicable to any other internal component of the host device. To enhance clarity of the description herein, the internal components of the host device are referred to as the host device components, and distinguished from internal components of a battery, which are referred to as battery components. As such, the disclosed examples for analysis of host device components such as batteries are not to be construed as a limitation of the scope of this disclosure.

As such, some aspects are directed to analysis of batteries enclosed in the host device. The host device may be any portable or mobile device, for example, or any other device which can be powered at least partially or for some durations of time by a battery. The analysis may be based on transmitting acoustic signals through at least a portion of the host device and studying responses thereof. Such analysis may include acoustic time-of-flight and acoustic resonance spectroscopy analysis to derive information about the physical characteristics of the batteries and/or other host device components present in or enclosed in the host device. The exemplary analysis may be conducted with the batteries remaining within or enclosed in the host device, without a need for removing the batteries from the host device for conducting the analysis.

Accordingly, some aspects of the disclosure are directed to a method for using acoustic excitations to test the physical properties of a battery or batteries that power a host device which may be battery-operated device, e.g., a portable electronic device. Also described is the use of the above method for assessing the condition, quality, state of charge, state of health, etc., of the battery, as well as assessing authenticity of the battery, e.g., whether the battery is genuine or counterfeit. Aspects of this disclosure also include an apparatus for carrying out the above-noted acoustic tests. Aspects of this disclosure also include testing of batteries, also referred to as "samples," contained within host devices, wherein the host devices may be powered by or intended to be powered by the batteries or samples under test.

As previously noted, conventional systems wherein aspects of this invention are not deployed may suffer from disruptive, time consuming, and/or potentially destructive approaches to battery inspection. For example, in conventional environments wherein portable devices may be inspected, e.g., during device manufacturing or assembly, device maintenance, law enforcement or security screening, etc., the physical properties of the battery within a portable device are difficult to assess without disassembly of the portable device or irradiation of the portable device with x-rays, which can be disruptive, time consuming, and potentially destructive. In contrast, the exemplary method and apparatus described herein are relatively fast, non-invasive, may be performed with the batteries present in the host device, and are non-destructive.

Figure 1B:
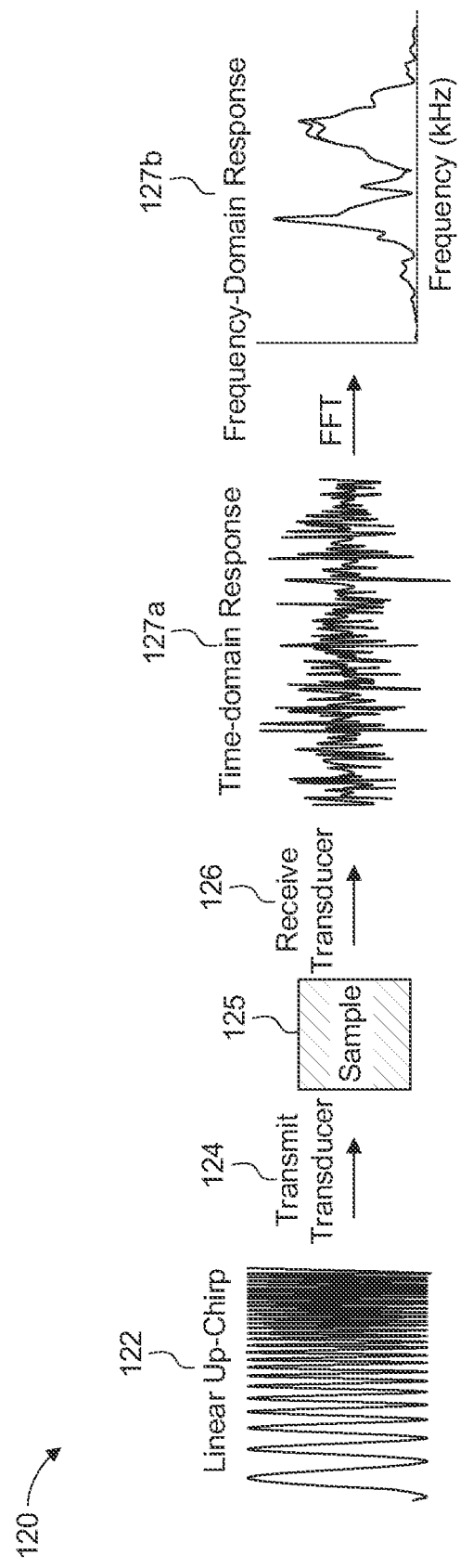

With reference to FIG. 1A, an exemplary analysis method 100 is shown for analyzing a host device comprising an internal host device components such as a battery. In the example wherein the host device component is a battery, the following description is provided, while noting that the description is equally applicable to analyzing any other host device components other than batteries. As such, step 102 involves generating an input acoustic signal. The input acoustic signal may be a single pulse, a set of acoustic pulses, a continuous acoustic wave, a chirp signal, or any other type of sound or vibration signal. FIG. 1B shows an example wherein the input signal is a linear up-chirp signal, and will be discussed further in the following sections.

Figure 3:
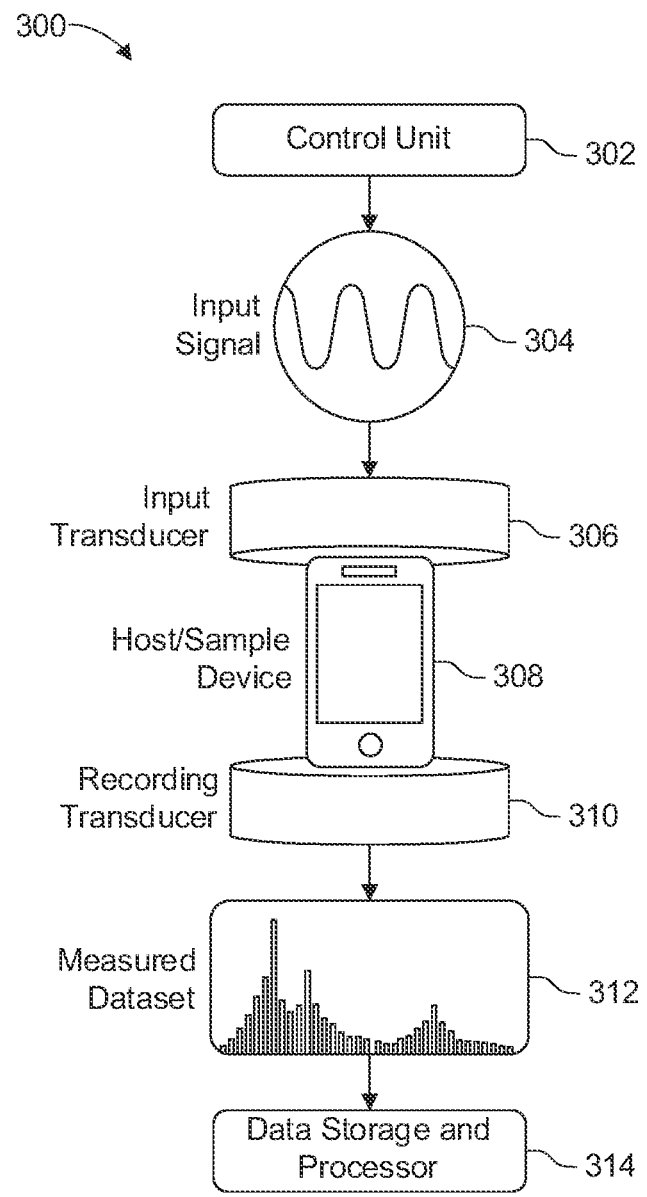
FIG. 3 illustrates a schematic of an apparatus configured for acoustic analysis of a component of a host device, according to aspects of this disclosure.

In step 104, the acoustic waves corresponding to the input acoustic signal are transmitted into the host device. FIG. 3 shows an example wherein transducers may be used to convert the input acoustic signal into acoustic waves, and will be discussed further in the following sections. The acoustic waves are caused to travel through at least a portion of the host device.

In step 106, response signals generated in response to the input acoustic signal are recorded (noting once again that particular means for receiving the response signals and recording them will be discussed with reference to FIG. 3). In exemplary aspects, it is recognized that the response signal will be sensitive to any changes or differences in the physical properties of the battery or battery components thereof. These physical properties may include density, modulus, dimensions, structure of the battery components. The battery components may include, for example, an anode, a separator, a cathode, etc.

For a given host device, the response signal changes as the result of physical changes in the battery, for example, due to device operation, charging, passive aging, or other variations. Between two host devices of the same type, the response signal changes as the result of physical differences between the batteries contained therein, for example, due to differences in construction quality, battery age or charge state, physical damage to the battery, tampering, authenticity of the battery (e.g., whether the battery is genuine or counterfeit), etc.

In step 108, the response signal or dataset from a test sample pertaining to the battery can be compared to a reference signal or reference dataset. In step 110, the comparison may be used to determine the physical properties or one or more physical characteristics of the battery under test contained in the host device.

For the above approach of method 100, the reference signal or reference dataset may be created from a reference sample or samples. Analysis of the measured or recorded data may occur in the time domain or in the frequency domain; time-frequency analyses or other advances in signal processing methods may also be employed, as will now be discussed with reference to FIG. 1B.

In FIG. 1B, a particular implementation of method 100 is shown and designated with the reference numeral 120. In method 120, a linear up-chirp 122 is used as the input signal. Chirp signals are understood to be periodic (i.e., sinusoidal) waves with frequencies that vary over time in a controlled manner, e.g., monotonically (i.e., increasing or decreasing). Linear up-chirp signal 122 has been illustrated to have uniform amplitude, wherein the amplitude may be varied by controlling driving voltage of an input transducer, for example. The frequency change in the chirp signal can happen in either the up (increasing frequency, decreasing wavelength) direction, as shown, or in a down (decreasing frequency, increasing wavelength) direction. This change in frequency change may be linear or nonlinear (e.g., functions such as logarithmic, exponential, etc.). The signal, linear up-chirp 122 as shown, is a chirp signal having monotonically increasing frequencies, the increase being linear. An exponential up-chirp signal (not shown in this example) would refer to chirp signal having monotonically increasing frequencies, the increase being exponential.

While input acoustic signals of a single frequency may be limited by the dispersive nature of the battery components using chirp signals, such as linear up-chirp 122, has been observed to lead to a controlled bandwidth being generated in the input acoustic signal. Accordingly, the dwell time of the input acoustic signals in the frequency domain may be utilized to provide broad-band information even in cases wherein excitation of the battery materials may be inefficient. As can be recognized, using chirp signals may advantageously minimize heat generated during the battery's diagnostics by avoiding the need to repeat input waveforms or measure response vibrations for long periods of time. This is advantageous because a build-up of heat inside the battery over the course of method 120 can skew the measurements or change the materials within the battery being observed or inspected. Moreover, chirps that vary nonlinearly in frequency may also be customized and optimized for particular response characteristics of driving and receiving transducers, respectively for transmitting chirp signals and receiving responses thereof. The input frequencies of acoustic chirps can be in audible (Hz-kHz) and ultrasonic (kHz and above) ranges without loss of generality.

With continuing reference to method 120, in step 124, linear up-chirp 122 is transmitted by a driving/transmit transducer into a host device shown as sample 125, which may comprise a host device component such as a battery. In step 126, the response signal is collected by a receive transducer. The reference numeral 127a represents a time-domain response of the response signal, which may be converted to frequency-domain response 127b (e.g., by performing a Fourier transform or fast Fourier transform (FFT) on time-domain response 127a). The response signals (time-domain response 127a, frequency-domain response 127b, or any other suitable representation thereof) provide information on the vibration modes of sample 125, which can be used to determine mechanical properties, condition of batteries in sample 125, etc.

The exemplary methods 100-120 of FIGS. 1A-B can be used to inspect the test sample 125 (e.g., comprising a test battery in a host device) or a series of test samples (e.g., for comparing one or more batteries in a host device or in more than one host devices of the same type), based on responses to the same input acoustic signal, for example. Some examples of where such analyses may be conducted include a device manufacturing or assembly line, in law enforcement or security screening settings, or in a device reliability testing or maintenance environment. The exemplary methods can also be used for a test sample or a series of test samples with repeated input acoustic signals per sample. Some examples of where the exemplary methods may be deployed include research settings, device reliability testing or maintenance, in-device diagnostic testing, etc.

FIGS. 2A-E illustrate various examples of applying the exemplary methods of FIGS. 1A-B for analyzing host device components such as batteries.

Figure 2A:
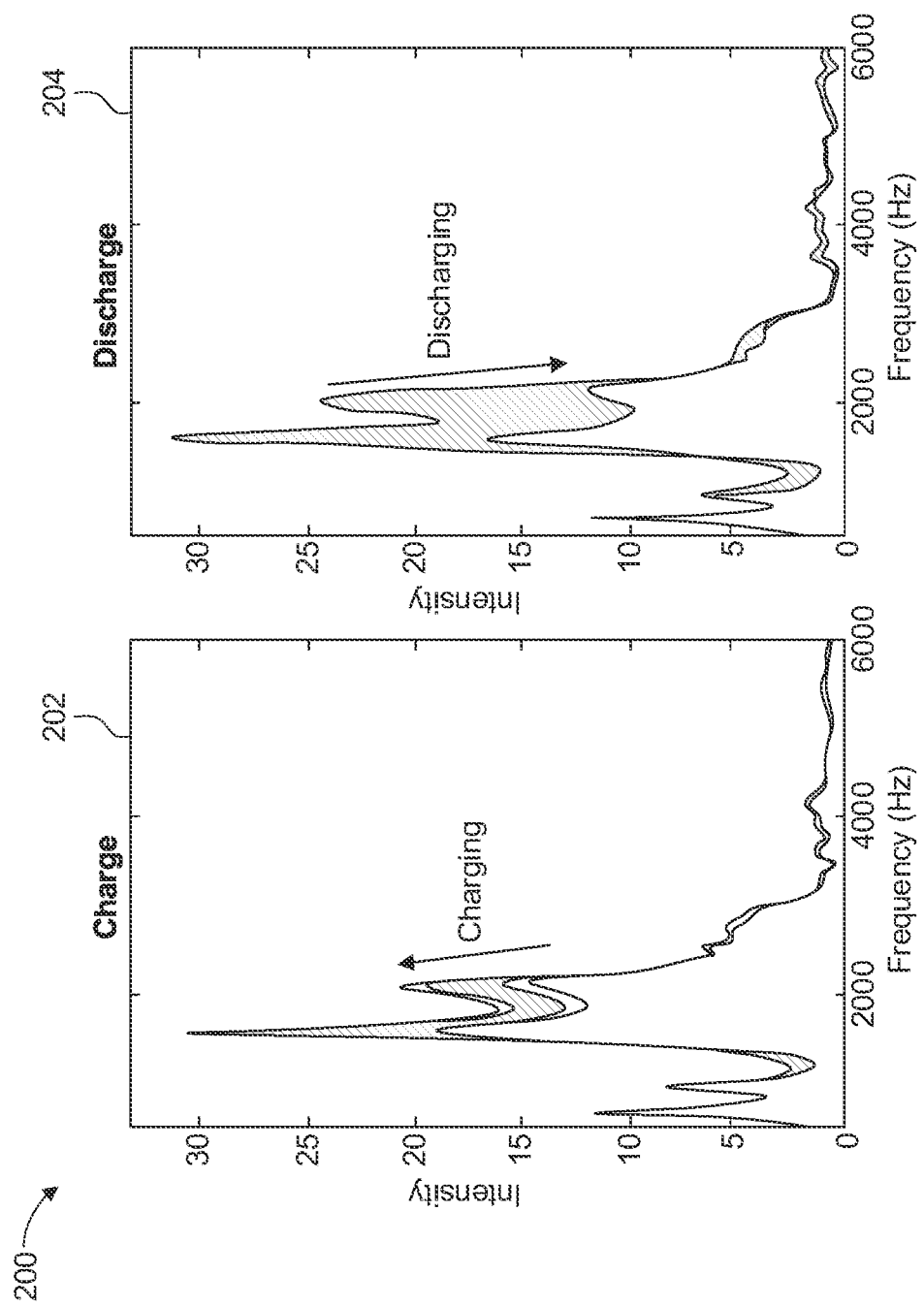
FIG. 2A illustrates example data from an exemplary acoustic analysis of a host device comprising a battery in different states including charging and discharging, according to aspects of this disclosure.

In FIG. 2A, example data 200 from an exemplary acoustic analysis for measuring changes in the battery of a host device, e.g., a mobile phone, through the casing of the mobile phone is shown. Specifically, graph 202 shows a response signal (intensity) in the frequency domain while the mobile phone is plugged in and charging. Also shown is graph 204, which shows the response signal's intensity while the mobile phone is discharged, e.g., during the mobile phone's operation.

Figure 2B:
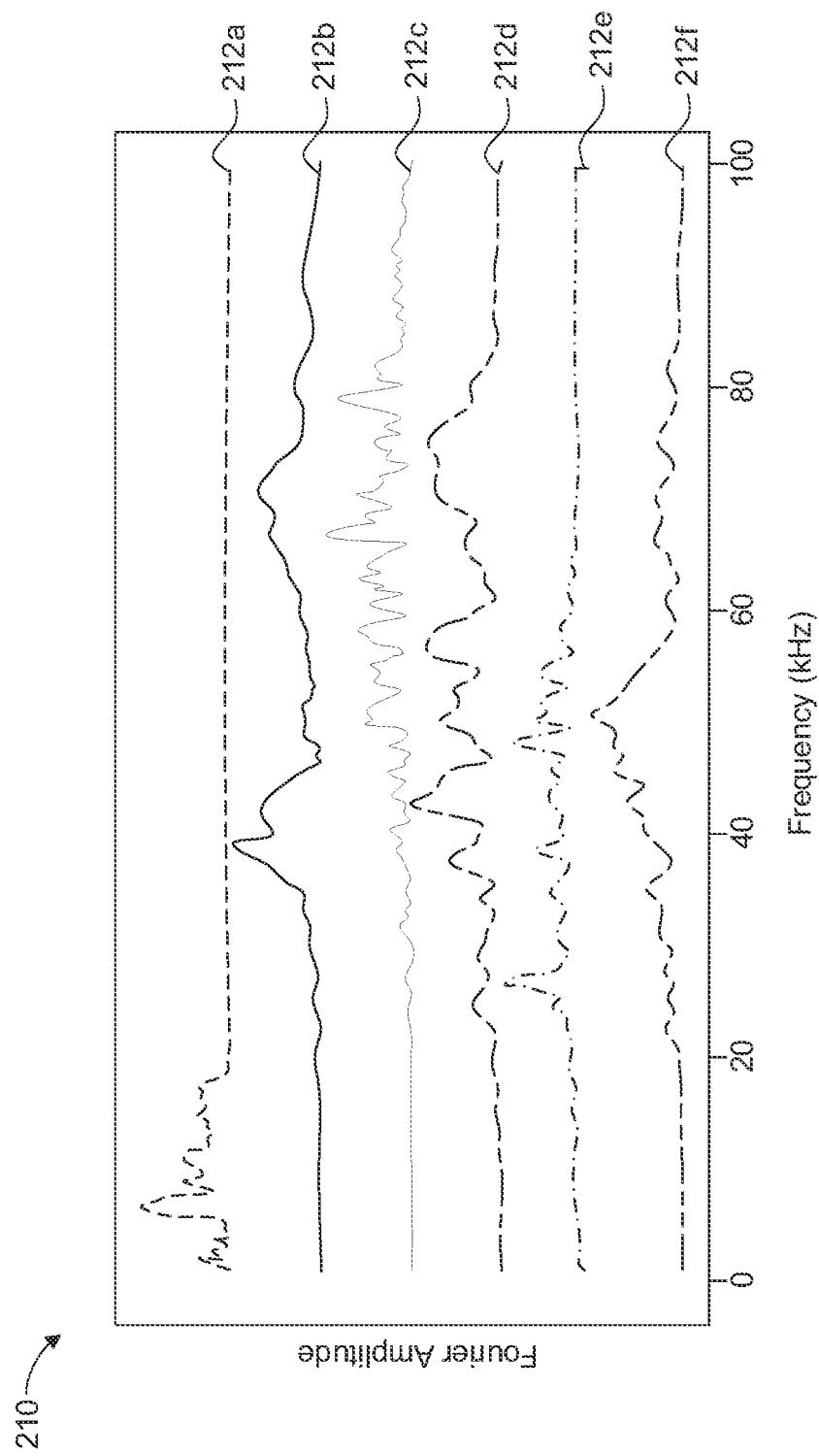
FIGS. 2B-E illustrate example frequency spectra for one or more host devices comprising various internal components such as batteries or replacements thereof, according to aspects of this disclosure.

In FIG. 2B, the frequency spectra 210 of different host devices 212a-f, e.g., different models/brands of mobile phones are shown. FIG. 2B may comprise one example of steps 108-110 of FIG. 1A discussed previously, for comparing different response signals and determining characteristics based on these comparisons. In an aspect, host devices 212a-f may each contain a battery. In one aspect, the batteries of some of host devices 212a-f may be different and the respective frequency spectra may differ at least partially based on differences in the batteries. In another aspect, some of the batteries of host devices 212a-f may be substantially similar, yet the frequency spectra may differ due to variations in other components of respective host devices 212a-f. The frequency spectra for each of host devices 212a-f may be used as signatures or reference models for comparisons with other devices. For instance, a library of frequency spectra such as those shown in FIG. 2B may be created for various mobile phone models. Subsequently, the library may be consulted when analyzing the frequency spectrum of a specific phone model used as a sample or test case for comparison. Any differences between frequency spectra during comparisons of the same phone model may reveal differences in mechanical properties of components such as batteries within the phone models.

Figure 2C:
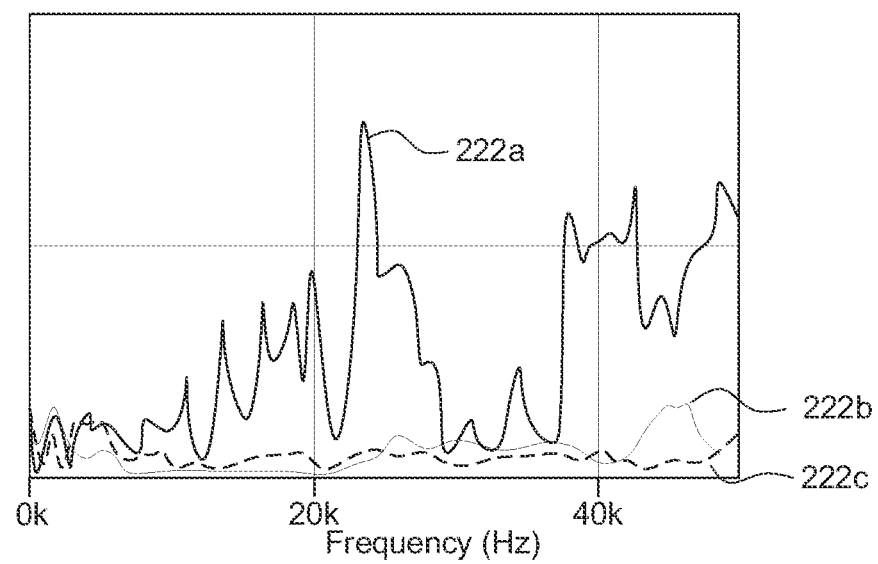

In FIG. 2C, the frequency spectra 220 of the same host device is shown for aspects in which the host device has a bad (e.g., heavily used, damaged, tampered, etc.) battery (222a), a good battery which is discharged (222b) and a good battery which is charged (222c). FIG. 2C is another example of steps 108-110 of FIG. 1A discussed previously, for comparing different response signals and determining characteristics based on these comparisons. In this instance, using 222a-c as reference, the frequency spectrum of a test sample may be analyzed, and the frequency spectrum that is closest to the test sample's frequency spectrum may reveal whether the test sample has a bad battery (i.e., the test sample has a frequency spectrum closest to 222a), a good discharged battery (i.e., the test sample has a frequency spectrum closest to 222b), or a good charged battery (i.e., the test sample has a frequency spectrum closest to 222c).

Figure 2D:
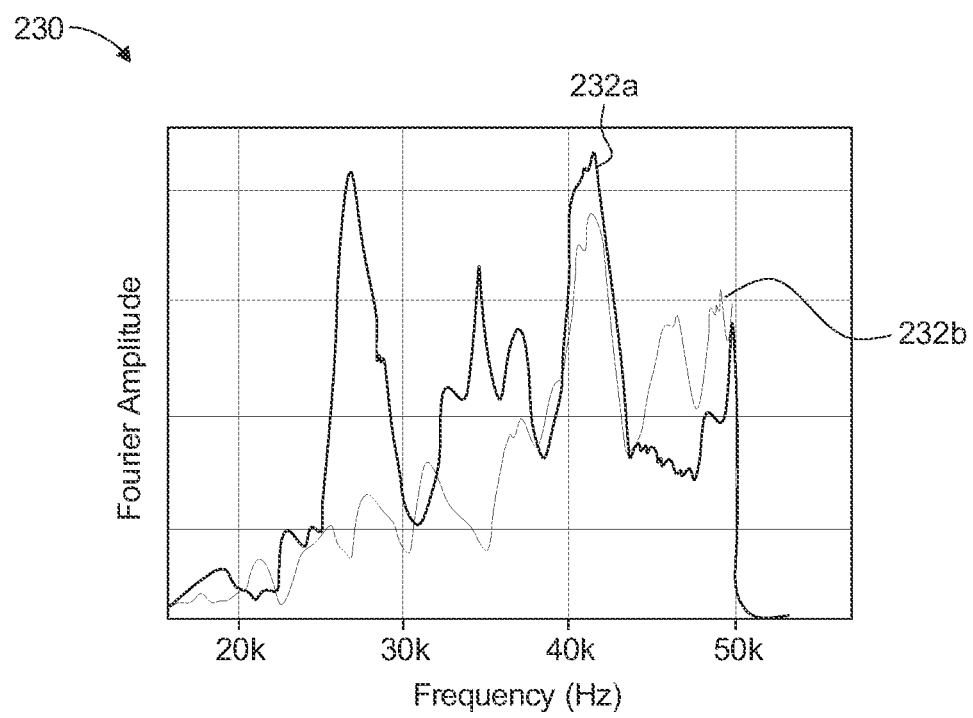

FIG. 2D illustrates the frequency spectra 230 of the same host device, for aspects in which the host device has a battery (232a), and the host device has a replacement material in place of a battery (232b). FIG. 2D is yet another example of steps 108-110 of FIG. 1A discussed previously, for comparing different response signals and determining characteristics based on these comparisons. In this instance, using 232a-b as references, the frequency spectrum of a test sample may be analyzed, and the frequency spectrum that is closest to the test sample's frequency spectrum may reveal whether the test sample has a battery (i.e., the test sample has a frequency spectrum closest to 232a), or has a replacement material in place of the battery (i.e., the test sample has a frequency spectrum closest to 232b).

Some example techniques for analyzing the test sample using frequency spectra of the same host device, such as in FIG. 2D are described as follows. Considering a host device, e.g., a mobile phone which has a replacement material as a host device component. The replacement material may be a battery which has been directly tampered with or may be a battery of a host device that has been tampered with in a manner which results in affecting the battery. As a result, the replacement material may have a frequency spectrum that is close to 232b, which would be a known frequency spectrum for a known replacement material. In this case, an apparatus used in analyzing the test sample may be designed to provide an indication if there is a match or correlation, to reveal information about the host device components which have been recognized, i.e., the replacement material. Alternatively, the replacement material may have a frequency spectrum that is quantifiably different from the normal or expected frequency spectrum 232a for the battery which has not been affected. The apparatus may also be configured to provide a corresponding indication if the replacement material's frequency spectrum differs significantly from the expected baseline frequency spectrum 232a, for example, to reveal that the mobile phone's battery has been significantly altered or replaced. Various other such analysis and configurations of apparatus to provide notifications are possible within the scope of this disclosure.

Figure 2E:
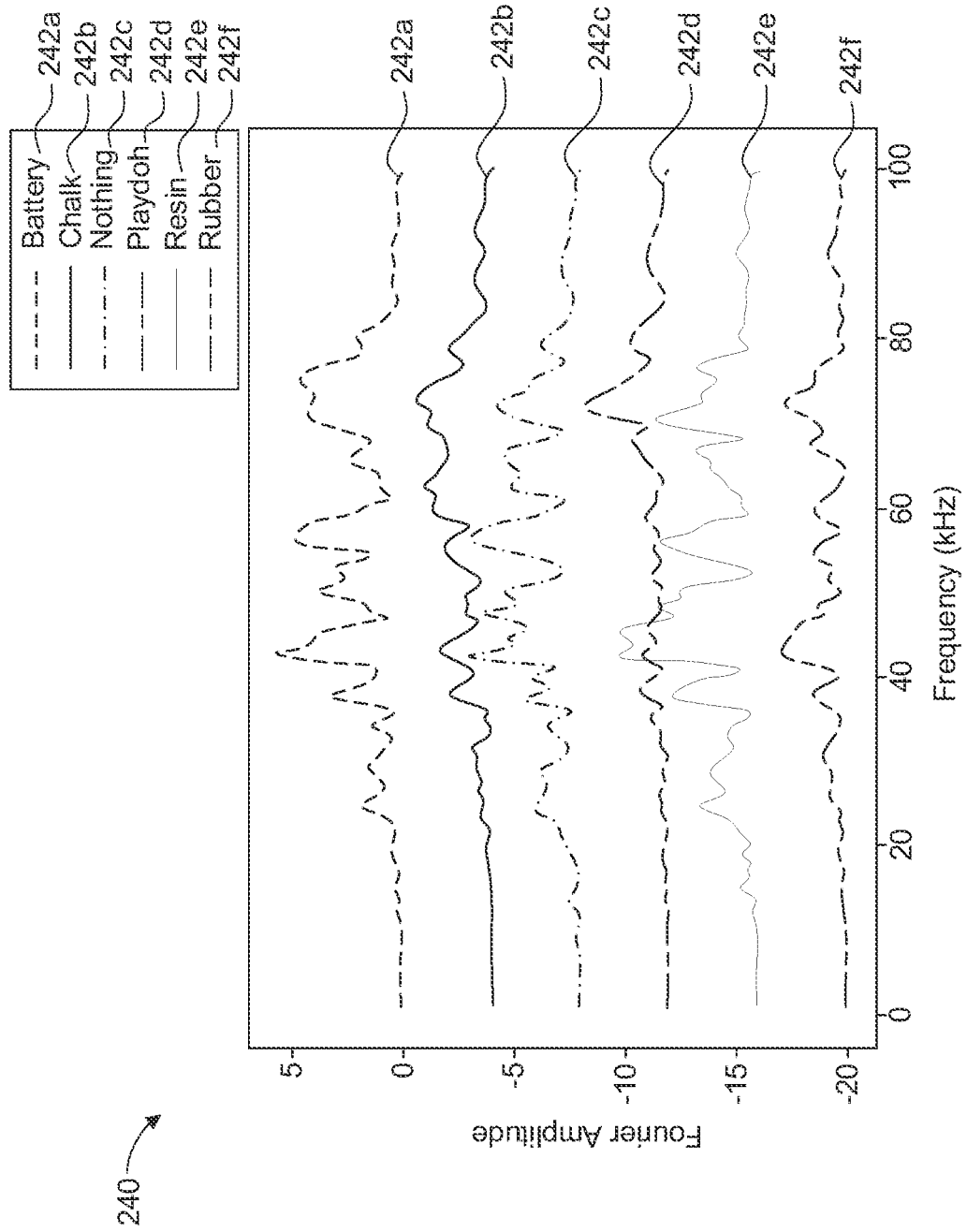

FIG. 2E represents yet another example of steps 108-110 of FIG. 1A discussed previously, for comparing different response signals and determining characteristics based on these comparisons. FIG. 2E illustrates the frequency spectra 240 of the same host device containing different components, including a battery and replacements thereof. As shown, frequency spectra are illustrated for the host device having a battery (242a), the host device has a first replacement material in place of a battery, e.g., chalk (242b), the host device has a second replacement material in place of a battery, e.g., nothing (242c), the host device has a third replacement material in place of a battery, e.g., playdough (242d), the host device has a fourth replacement material in place of a battery, e.g., resin (242e), and the host device has a fifth replacement material in place of a battery, e.g., rubber (242f). Using 242a-f as references, the frequency spectrum of a test sample may be analyzed, and the frequency spectrum that is closest to the test sample's frequency spectrum may reveal whether the test sample has a battery (i.e., the test sample has a frequency spectrum closest to 242a), or has a replacement material in place of the battery, and which specific type of replacement materials among the first to fifth replacement materials discussed above may be present (i.e., the test sample has a frequency spectrum closest to one of 242b-f).

It will be appreciated that reference spectra such as frequency spectra 210-240 of FIGS. 2B-E may be created for components of a host device such as batteries or any other alternatives. Accordingly, it is seen that aspects of this disclosure are not limited to analyzing batteries but are equally applicable for any other components encased within a host device. Moreover, there is no limitation on the type of encasing, and as such, exemplary techniques may be utilized for acoustic analysis of any component which is partially or fully encased/enclosed/contained within a host device.

FIG. 3 illustrates an exemplary apparatus 300 according to this disclosure configured to implement an acoustic testing method, such as methods 100-110, for testing a component within host device 308 (alternatively referred to as a sample device). The component being tested may be a battery in some cases, as noted above. Host device 308 may itself be enclosed within a casing or housing, without departing from the scope of this discussion (e.g., in the example wherein host device 308 is a mobile phone, the mobile phone may be enclosed within a protective cover or case, and apparatus 300 may be configured to analyze a battery within the mobile phone while the protective cover remains in place on the mobile device, without requiring the mobile phone to be extracted from the protective cover).

Control unit 302 may control the generation of an input signal 304, which may be an acoustic signal as shown in FIG. 1B, for example. For example, control unit 302 may be configured to cause a computer-controlled sound source to generate input signal 304. Control unit 302 may be external to host device 308.

Input signal 304 may be transmitted into host device 308 through host device 308 (or a protective cover/casing around host device 308, if present) by using input transducer 306 or other mechanical means. Alternatively, in host devices that contain an internal vibrator motor (e.g., a mobile phone) the input signal 304 can be generated internally by using the internal vibrator motor.

The response acoustic signals generated based on the transmission of the input signal 304 into host device 308 can be recorded from host device 308 (or a casing, if present) using external sensors such as recording transducer 310 as shown. Alternatives to recording transducers 310 may include an external accelerometer coupled to host device 308, or with host device 308 placed on a test rig with a transducer or accelerometer affixed/coupled to it. In certain host devices that contain internal accelerometers or other vibration sensors (e.g. cell phones, tablets, or laptops) the response acoustic signals can also be measured with an internal sensor.

Depending on the desired measurement and analysis approach, external transmit and receive transducers may be placed opposite from each other on the host device, or on the same side of the host device as each other. Additionally, multiple receive transducers such as recording transducer 310 may be used to record the response signals. Regardless of if they are used to transmit or record sound signals, external transducers, e.g., input transducer 306 and recording transducer 310, may be coupled to host device 308 by any means, including automated or computer-controlled means. Host device 308 may also be placed onto the transducers or into a testing fixture manually, or by automated or computer-controlled means.

The recording transducers 310 may generate the dataset recorded, shown as measured dataset 312. Measured dataset 312 may include any form of recorded data, such as time-domain response 127a or frequency-domain response 127b of FIG. 1B. Moreover, the various frequency spectra discussed with reference to FIGS. 2A-E may also be representative of the type of data shown as measured dataset 312.

Data storage and processor 314 represents memory and processing means which may be used to compare the signal or measured dataset 312 recorded from the test sample, with a reference signal, dataset, or database to determine the physical characteristics of the battery contained in host device 308. For instance, steps 108 and/or 110 of FIG. 1A may be performed by data storage and processor 314 or suitable alternative means. From that comparison, data storage and processor 314 may be configured to provide information about the battery within host device 308, such as charge level, battery quality, or whether or not host device 308 contains a counterfeit or tampered battery. For instance, comparison against the suitable ones of frequency spectra 210-240 of FIGS. 2B-E may reveal the above information.

The exemplary acoustic or sound-based tests, e.g., according to methods 100-110, and/or performed using apparatus 300, may occur in conjunction with other tests, such as measurement of device weight or distribution of weight within a host device containing a battery under test; measurement of a sample shape or dimensions via physical, optical, or other means; chemical residue; and so on. These other tests may provide additional information which may improve the fidelity of the sound-based analysis.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Accordingly, an aspect of the invention can include a computer-readable media embodying a method of performing acoustic testing of batteries in portable devices. Accordingly, the invention is not limited to illustrated examples and any means for performing the functionality described herein are included in aspects of the invention.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. A method comprising:
   transmitting one or more input acoustic signals into at least a portion of a battery while the battery is housed within an electronic device;
   detecting one or more response signals generated in response to the one or more input acoustic signals; and
   analyzing one or more physical characteristics of the battery based on the one or more response signals.

2. The method of claim 1, further comprising generating the one or more input acoustic signals via a sound source external to the electronic device.

3. The method of claim 1, comprising generating the one or more input acoustic signals via a sound source housed within the electronic device, wherein analyzing the one or more physical characteristics of the battery comprises determining the one or more physical characteristics of the battery based on the one or more response signals and without removing the battery from the electronic device.

4. The method of claim 1, wherein the electronic device is powered by the battery.

5. The method of claim 1, wherein transmitting the one or more input acoustic signals comprises transmitting the one or more input acoustic signals through a casing of the electronic device.

6. The method of claim 1, further comprising detecting the one or more response signals using one or more recording transducers.

7. The method of claim 1, further comprising storing the detected one or more response signals and comparing the one or more response signals to a reference set of signals, and wherein analyzing the one or more physical characteristics of the battery is based on the comparison.

8. The method of claim 1, wherein the one or more physical characteristics of the battery comprise charge level, battery quality, authenticity of the battery, physical condition including tampering of the battery, or combinations thereof.

9. The method of claim 1, further comprising performing one or more tests comprising measurement of a weight or distribution of weight within the electronic device, measurement of a shape or dimensions of the battery, measurement of chemical residue, or combinations thereof.

10. A method comprising:
    transmitting one or more input acoustic signals into at least a portion of a host device;
    detecting one or more response signals generated in response to the one or more input acoustic signals;
    comparing the one or more response signals with one or more predetermined response signals of one or more internal components associated with the host device; and
    based on a difference between the one or more response signals and the one or more predetermined response signals, detecting a modification to internal contents of the host device, the modification including one or more of removing one or more objects from the internal contents of the host device, replacing one or more of the internal contents with one or more different objects, or adding one or more new objects to the internal contents of the host device.

11. An apparatus comprising:
    a signal source configured to transmit one or more input acoustic signals into at least a portion of a host device;

one or more sensor devices configured to detect one or more response signals generated in response to the one or more input acoustic signals; and one or more processors configured to:
compare the one or more response signals with one or more predetermined response signals of one or more internal components associated with the host device; and based on a difference between the one or more response signals and the one or more predetermined response signals, detect a modification to internal contents of the host device, the modification including one or more of removing one or more objects from the internal contents of the host device, replacing one or more of the internal contents with one or more different objects, or adding one or more new objects to the internal contents of the host device.

12. The apparatus of claim 11, further comprising a control device configured to the signal source to generate the one or more input acoustic signals, the control device being external to the host device.

13. The apparatus of claim 11, comprising a control device configured to the signal source to generate the one or more input acoustic signals, wherein the control device being internal to the host device.

14. The apparatus of claim 11, further comprising a transmitter device that transmits the one or more input acoustic signals into at least the portion of the host device.

15. The apparatus of claim 11, wherein the one or more input acoustic signals are transmitted into at least the portion of the host device through a casing of the host device.

16. The apparatus of claim 11, wherein the internal content of the host device comprises at least one of a battery or a portable electronic device.

17. The apparatus of claim 16, wherein the one or more processors are configured to determine one or more physical characteristics of the internal contents of the host device, and wherein the physical characteristics comprise charge level, battery quality, authenticity of the battery, physical condition including tampering of the battery, or combinations thereof.

18. The apparatus of claim 16, wherein the one or more processors are configured to perform one or more tests comprising measurement of a weight or distribution of weight within the host device, measurement of a shape or dimensions of the battery, measurement of chemical residue, or combinations thereof.

* * * * *